US006485531B1

(12) United States Patent
Schöb

(10) Patent No.: US 6,485,531 B1
(45) Date of Patent: Nov. 26, 2002

(54) PROCESS CHAMBER

(75) Inventor: Reto Schöb, Volketswil (CH)

(73) Assignee: Levitronix LLC, Waltham, MA (US)

( * ) Notice: Subject to any disclaimer, the term of this patent is extended or adjusted under 35 U.S.C. 154(b) by 0 days.

(21) Appl. No.: 09/384,818

(22) Filed: Aug. 27, 1999

(30) Foreign Application Priority Data

Sep. 15, 1998 (EP) .............................................. 98810916

(51) Int. Cl.$^7$ .......................... H01L 21/00; H01L 21/64
(52) U.S. Cl. .................................................... 29/25.01
(58) Field of Search ..................... 29/25.01; 118/500, 118/730, 52

(56) References Cited

U.S. PATENT DOCUMENTS 4,856,456 A * 8/1989 Hillman et al.
5,818,137 A * 10/1998 Nichols et al.
5,871,588 A * 2/1999 Moslehi et al.
6,049,148 A * 4/2000 Nichols et al.

FOREIGN PATENT DOCUMENTS

| EP | 0825279 A1 | 2/1998 |
| WO | WO9703225 | 1/1997 |
| WO | WO9855214 | 11/1998 |

* cited by examiner

Primary Examiner—David E. Graybill
(74) Attorney, Agent, or Firm—William Michael Hynes; Townsend and Townsend and Crew LLP

(57) ABSTRACT

In a process chamber (1), in which various processing steps in the manufacture of semiconductors can be carried out, there is arranged a rotationally drivable rotary head (3) which serves as a holder for a substantially disc-shaped object to be processed (W), e.g. for a wafer. Furthermore, at least one applicator (50, 51, 52, 53) is provided in the process chamber (1) for the provision of a medium which acts on the object to be processed (W). Means (4) are arranged radially around the rotary head (3) for the journalling and for the driving of the rotary head (3).

15 Claims, 5 Drawing Sheets

PROCESS CHAMBER

Figure 1:
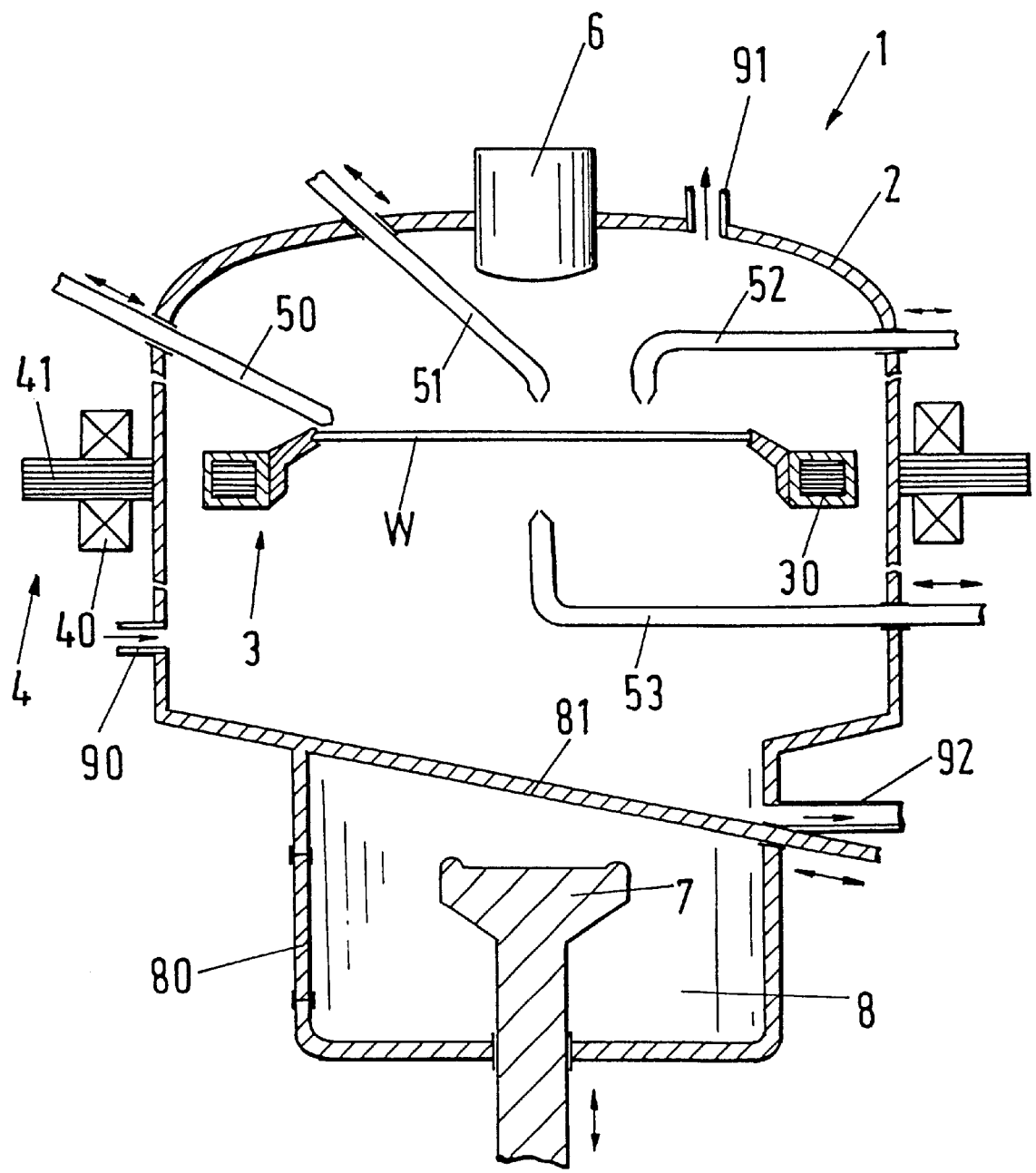

The invention relates to a process chamber in which various processing steps in the manufacture of semiconductors can be carried out in accordance with the preamble of the independent patent claim.

Several processing steps in the manufacture of semiconductors, in particular in the manufacture of integrated semiconductor circuits, take place in such a manner that the wafer (a disc on which a large number of such integrated semiconductor circuits are arranged) is rotated in a process chamber. In addition to this it is often necessary to carry out the individual steps under clean room conditions. In the individual processing steps, in particular media such as liquids (e.g. etching liquids, cleaning fluids, photosensitive resists, developers, etc.), vapours (e.g. metallic vapours or liquid vapours etc.), gases (etching gases, oxygen for oxidation, flushing gases, protective gases, etc.), suspensions (e.g. for the production of passivating layers and other thick film layers), molten polysilicon, electromagnetic waves, ion beams and yet others are applied to or act on the wafer respectively. Several selected processing steps will be briefly mentioned in the following in an exemplary manner which take place in a process chamber in which the wafer is rotated.

For example a photosensitive resist can be applied from a liquid nozzle (or else from a spray can) to the rotating wafer, such as is described for example in U.S. Pat. No. 5,395,803. Alternatively, it is also possible to apply the photosensitive resist to the wafer at rest and then to rotate the latter, as is for example described in U.S. Pat. No. 4,822,639.

As a result of the increased surface tension at the edge of the wafer, slight super-elevations often occur here, which must be removed. This takes place in that a solvent is applied to the rotating wafer in the peripheral region, as is e.g. described in U.S. Pat. No. 4,510,176. This processing step can for example also be combined with the application of the photosensitive resist, which is described for example in U.S. Pat. No. 5,773,083.

In another processing step for example suspensions are applied and passivating layers thereby produced on the wafer. In this, in a manner similar to the photosensitive resist coating, for example liquids with smallest glass or silicon dioxide particles are applied, which then produce the passivating layer. Processing steps of this kind are for example described in U.S. Pat. No. 5,376,176 or in U.S. Pat. No. 5,328,871. In layers produced in this manner a processing step is likewise required in which edge super-elevations are removed (as e.g. described in U.S. Pat. No. 4,732,785).

It is furthermore also possible to produce thin film layers on rotating wafers, e.g. of silicon dioxide, of metals or of carbon (DLC=Diamond-Like Carbon). For this purpose the wafers are coated by means of known procedures such as for example the CVD (Chemical Vapour Deposition) process or the PVD (Physical Vapour Deposition) process. In these processes the homogeneity of the coating of the wafer can be advantageously influenced through the rotation of the wafer, in particular when the wafer rotates very rapidly, e.g. with speeds of rotation up to 16,000 rpm. Methods of this kind are described for example in U.S. Pat. No. 5,630,881.

Furthermore, methods of this kind are also suitable, for example through the application of molten silicon to a rotating plate, to manufacture polycrystalline silicon wafers, in a manner similar to that already described in the production of the "thick" layers. This is e.g. described for example in U.S. Pat. No. 4,561,486.

Furthermore, it is also possible to apply liquid or gaseous solvents to a rotating wafer for the removal of coatings, e.g. for the removal of photosensitive resists. This is described e.g. in U.S. Pat. No. 4,749,440 or in U.S. Pat. No. 4,510,176.

Moreover, it is also possible to exploit the rotating wafer for various etching processes. This is advantageous in so far as a homogeneous etching speed is therein achieved over the entire wafer, which can be of importance in particular in order to avoid an under-etching. If for example etching liquid is applied to the rotating wafer from a nozzle, then a homogeneous etching film develops, which is uniformly renewed in a manner which is controlled by the liquid supply. This is described for example in U.S. Pat. Nos. 4,903,717 or 4,350,562. Alternatively, it is also possible to allow the wafer to rotate on a liquid film, as is described in U.S. Pat. No. 4,350,562.

In other etching processes, etching vapours or etching gases are used for the etching of the wafer, as is described for example in U.S. Pat. No. 5,370,741, in U.S. Pat. No. 5,174,853 or in U.S. Pat. No. 5,248,380. The wafer which is exposed to these vapours or gases is likewise rotated during the etching process. In this etching process it is also possible to etch both sides of a wafer at the same time (U.S. Pat. No. 4,857,142). In the so-called "plasma etching" process a gas which is ionised with the help of an electrical field ("plasma") is used for the etching. This is for example described in U.S. Pat. No. 4,230,515. In all the described etching processes it is advantageous when the wafer is rotated.

Furthermore, it is also possible to carry out ion implantations on rotating wafers. In this the wafer, which rotates with a speed of rotation of about 500–1500 rpm, is bombarded with ion beams. For this a plurality of wafers are normally arranged on a rotary plate, as is described in U.S. Pat. No. 4,745,287.

Further processing steps with rotating wafers relate to the washing of the wafer ("spin rinsing") similarly as in "spin etching", in which the wafer is charged with a cleansing liquid, e.g. with water of highest purity. The drying of the wafer is also possible in this manner: Liquid residues are hurled outwards by centrifugal forces ("centrifugal wafer dryer"), see e.g. U.S. Pat. No. 4,300,581.

Although only a selected number of processes or process steps respectively have been described above, there are numerous further process steps or processing steps respectively of this kind which are carried out in a process chamber with rotating wafers. In this, various media—among them radiation is also to be understood—such as liquids, suspensions with solids, gases and vapours, electromagnetic fields, ion beams etc. are applied to the wafer as a rule with the help of applicators such as nozzles and nozzle systems (heads with a large number of nozzles), tube systems, radiation sources, electrodes, heating elements and heat radiators.

In this the wafer is at least individually rotated, or else a plurality of wafers are rotated in common with the help of a corresponding rotatable holder apparatus. This holder apparatus is designated in the following as a rotary head for the sake of simplicity. The rotary head, which holds and rotates the wafer, is often driven via a rotating shaft most often from below, sometimes also from above. In this the rotating shaft is introduced into the inner space of the process chamber via a seal from below or from above. The drive motor is located as a rule outside the inner space of the process chamber in order to keep the inner space of the process chamber free from contaminations (clean room conditions) and to protect the motor against corrosion.

The applicators (nozzles, nozzle systems, tube lines, electrodes, radiation sources, etc.) are necessarily located above or below the rotary head. Only in exceptional cases (application of gases) is it possible to treat the wafer from both sides. In every case, however, the driving of the rotary head from below or from above represents a restriction in regard to the arrangement of the applicators.

This manner of driving and journalling the rotary head also represents an additional restriction for the supplying of the wafer or wafers respectively. The wafer (the wafers) can—when the rotary head is driven from below—not be supplied from below. The supplying from above is mostly also not possible due to the arrangement of the applicators, so that in such cases the wafer can practically only be supplied from the side—stated more precisely, from laterally above the rotary head. This makes the centering of the wafer considerably more difficult and in addition limits the freedom of the arrangement of the applicators because, of course, the free access from the side up to the centre of the rotary head must be ensured.

The object of the invention is thus to propose a process chamber in which different processing steps can be carried out in the manufacture of semiconductors, in which process chamber the named spatial restrictions with respect to the arrangement of applicators are not present. The supplying of the wafer should also be more simply possible than in known process chambers.

This object is satisfied by a process chamber such as is characterised by the features of the independent patent claim. In particular, a rotationally drivable rotary head is arranged in the process chamber which serves as a holder for a substantially disc-shaped object to be processed, e.g. for a wafer. Furthermore, at least one applicator is provided. in the process chamber for the provision of a medium which acts on the object to be processed. Arranged radially around the rotary head, means are provided for the journalling and the driving of the rotary head. This radial arrangement enables, depending on the arrangement of the applicators, the wafer to be supplied centrally from below or from above and thus facilitates a centering of the wafer.

Furthermore, it is possible through the radial arrangement of the means for the journalling and for the driving around the rotary head to process the introduced wafer both from above and from below without this being excluded by a drive shaft or the like.

The means for the journalling and the driving of the rotary head are preferably formed in such a manner that they journal and drive the rotary head without contact; in particular these means comprise a magnetic bearing/drive unit, which is often designated as a "bearing-free motor".

In this the magnetic bearing/drive unit can comprise a stator which is arranged outside the housing of the process chamber and the rotary head can be arranged inside the housing, with the (non-magnetic) housing wall forming a tubular gap, which seals the inner space of the housing against the outside. Through this, on the one hand, the gap between the rotary head and the stator can be kept small (which has a greater stiffness of the bearing as a result when the flux is the same); on the other hand, a possibly corrosive medium always remains in the inner space of the housing and can not penetrate to the outside.

In an exemplary embodiment of the process chamber in accordance with the invention all six degrees of freedom of the rotary head, namely the two degrees of freedom of the displacement in the bearing plane, the axial displacement, the two degrees of freedom of tilting and the rotation, can be actively controlled. This enables a very precise positioning of the rotary head in regard to each of the degrees of freedom, but is naturally more complicated and expensive from the point of view of the electronics than the two following variant embodiments.

In one of these variations two degrees of freedom of the rotary head can be actively controllable, namely the two degrees of freedom of the displacement in the bearing plane, whereas the other four degrees of freedom are passively stabilised. This reduces the cost and complexity in the electronics; in return, however, the axial displacement, the rotation and the two degrees of freedom of the tilting are merely passively stabilised. As concerns the axial displacement and the tilting of the rotary head, this means that a rotary head which has been deflected out of its passively stabilised position with respect to one of these degrees of freedom is brought back into its stable position through reluctance forces as long as the deflection is not greater than a threshold value. When this threshold value is exceeded, however, a stable journalling of the rotary head is no longer provided. As concerns the rotation, this means that the rotary head can be e.g. magnetically coupled to the bearing stator and this bearing stator itself is designed to be rotatable. As a result of the magnetic coupling, then, the rotary head is co-rotated when the bearing stator is rotated.

In another, particularly preferred variant, three degrees of freedom of the rotary head can be actively controlled, namely the two degrees of freedom of the displacement in the journalling plane and the rotation, whereas the other three degrees of freedom, namely the axial displacement and the two degrees of freedom of the tilting are passively stabilised. Through this, on the one hand, the cost and complexity of the electronics is still comparatively low; on the other hand, however, the stator need not be designed to be rotatable, but rather the rotary head can be driven rotationally by means of a rotary field.

In an advantageous embodiment of the process chamber in accordance with the invention the rotary head is designed in such a manner that the object to be processed can be connected outside the inner space of the process chamber to the rotary head in such a manner that it is held by the latter. The object to be processed can then be brought into the inner space of the process chamber together with the rotary head. This has the advantage that a precise positioning of the object, e.g. of the wafer, relative to the rotary head can take place outside the process chamber, where the rotary head is better accessible. In addition it is possible in this manner to connect the wafer only a single time very precisely to the rotary head and then to pass on the unit formed by the rotary head and the wafer from one processing station to another processing station without it being necessary to position the wafer anew on another rotary head. This can take place within a system of process chambers which are connected by locks in order that the clean room conditions are not violated in the mean time, with the degree of cleanliness continually increasing in successive process chambers.

The rotary head can be designed in such a manner that the object held by the rotary head—e.g. the wafer—can be charged from both sides by a medium which is provided by the applicator. This is advantageous in so far as for example both sides of the wafer can be processed at the same time. The processing of the two sides can however also take place sequentially. In any case it is possible to process both sides of the wafer without it being necessary to rotate the wafer for this, such as is the case when it—as in a large number of the apparatuses from the prior art discussed in the introduction—lies in contact on a rotary plate with a drive shaft.

The rotary head can be designed substantially in the shape of a ring for this. In the interior of the rotary head however a disc with passage channels can also be fitted in, with the object to be processed, e.g. the wafer, being held at a distance from this disc by the rotary head. This disc can form a nozzle system through which the wafer can be charged e.g. with vapours or gases.

In another embodiment of the process chamber the rotary head can be designed substantially in the shape of a disc and the object to be held can be held in a central region of the rotary head. The rotary head is designed to have a declination in the peripheral region around this central region in order that a liquid which is applied to the object to be processed, and which flows outwardly over the object to be processed when the rotary head is rotationally driven, can run off over the peripheral region of the rotary head.

In a further development of this variant the rotary head has, around the peripheral region which is designed with a declination, a tub for the liquid which has passage openings at its base for the liquid which is caught in the tub. This variant is advantageous in so far as thereby the air gap between the rotary head and the stator can be kept small; on the other hand, the liquid need not also run off through this gap, which is small as it is. Instead, the liquid can be caught in the tub and can run off through the passage openings in the base of the tub.

In a further exemplary embodiment of the process chamber the rotary head which serves for the object to be processed, e.g. for the wafer, has means with the help of which a depression is conducted to the object to be processed which sucks the object to be processed firmly onto the rotary head. This can preferably even take place outside the inner space of the housing of the process chamber so that the wafer can be positioned on the rotary head at an easily accessible location and then sucked on. Once sucked on, the rotary head together with the sucked on wafer is then transported into the inner space of the housing of the process chamber. For the production of a depression at the rotary head which serves as a holder, for example a vacuum pump can be provided, which is preferably fed inductively.

Figure 2:
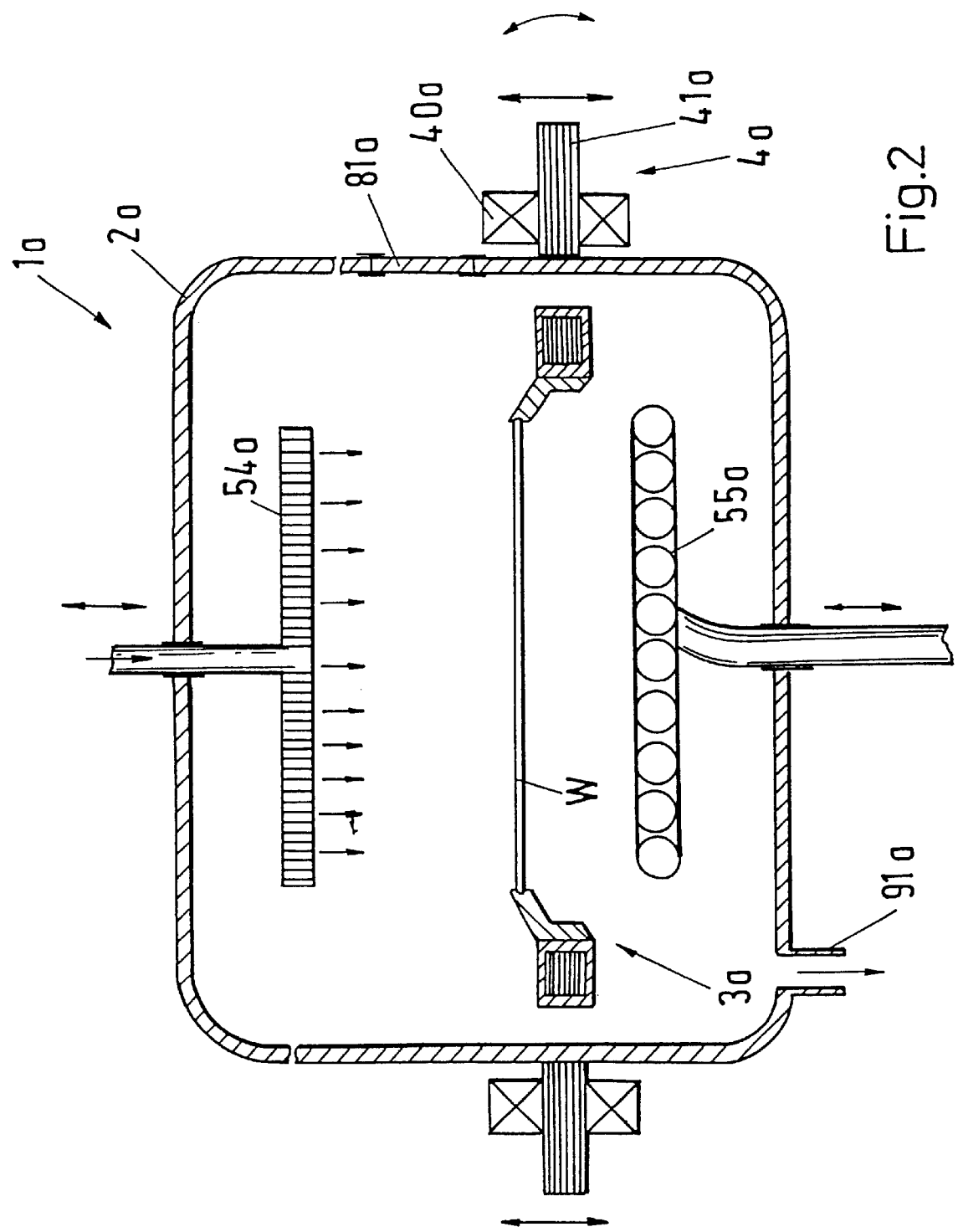
Figure 3:
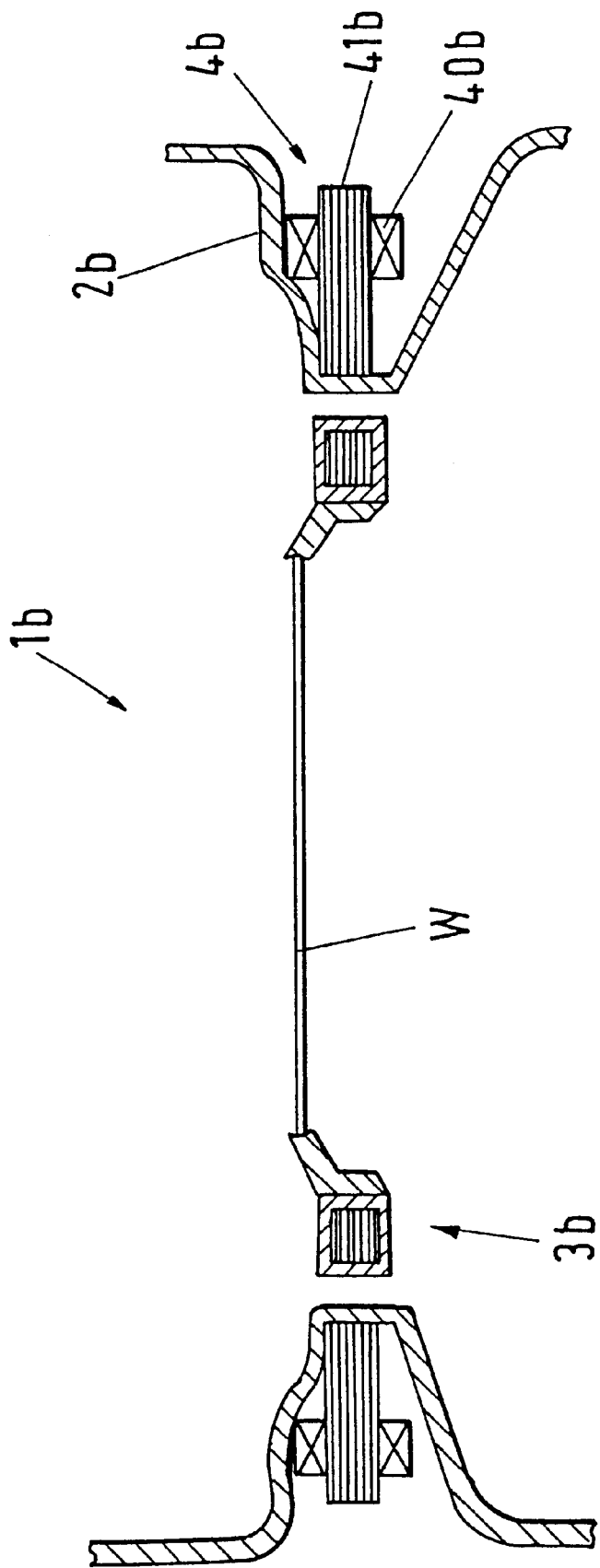
Figure 4:
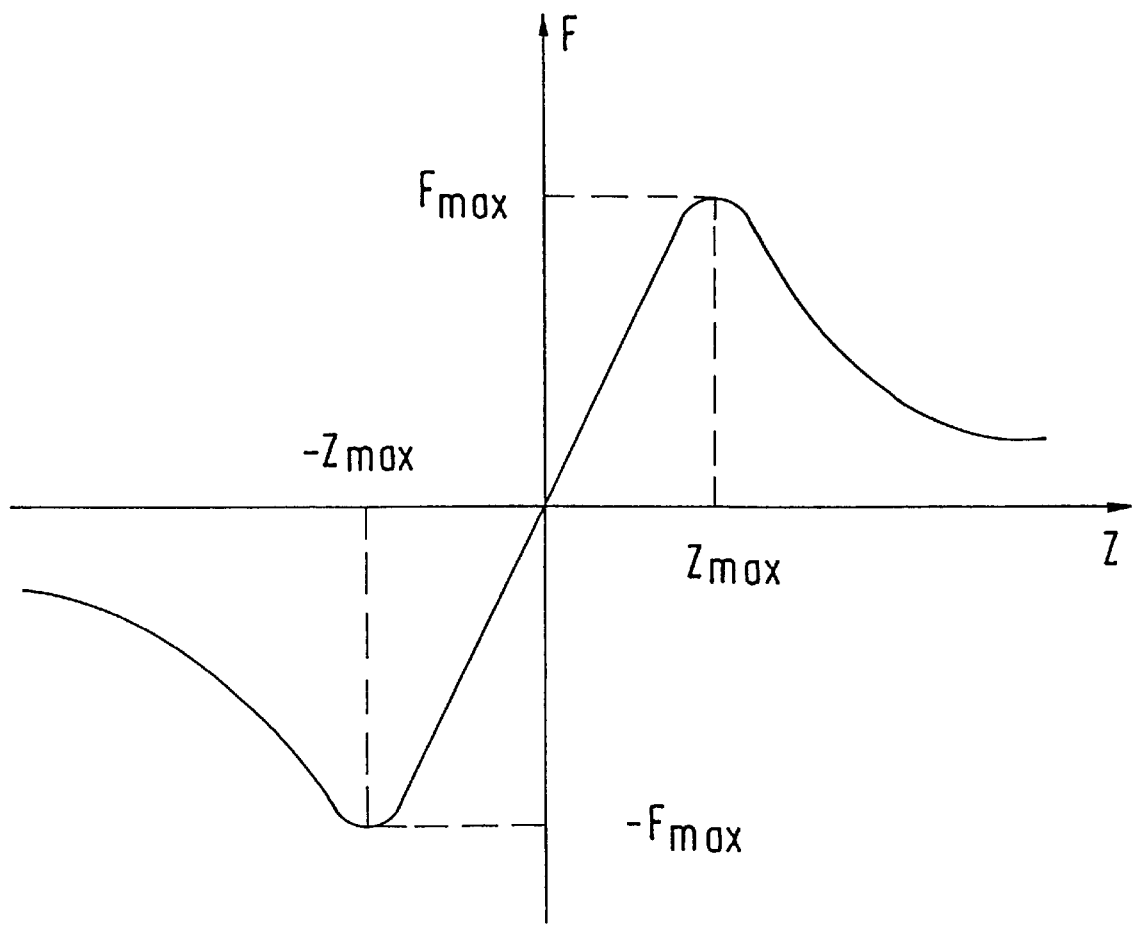
Figure 5:
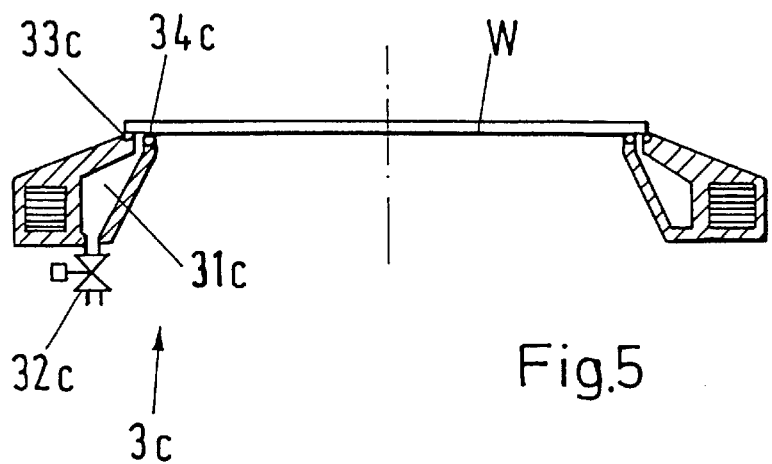
Figure 6:
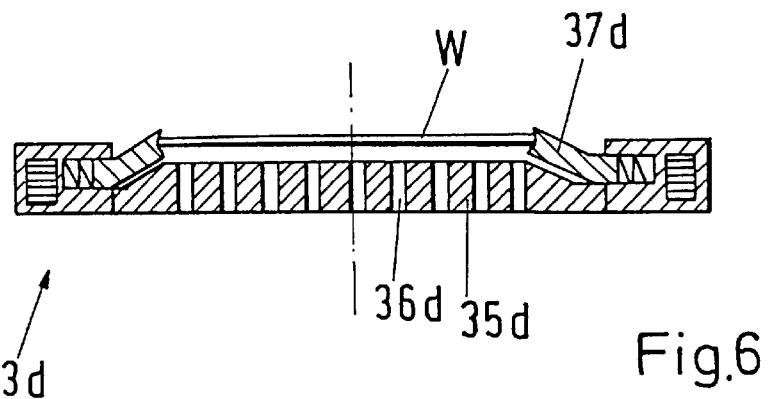
Figure 7:
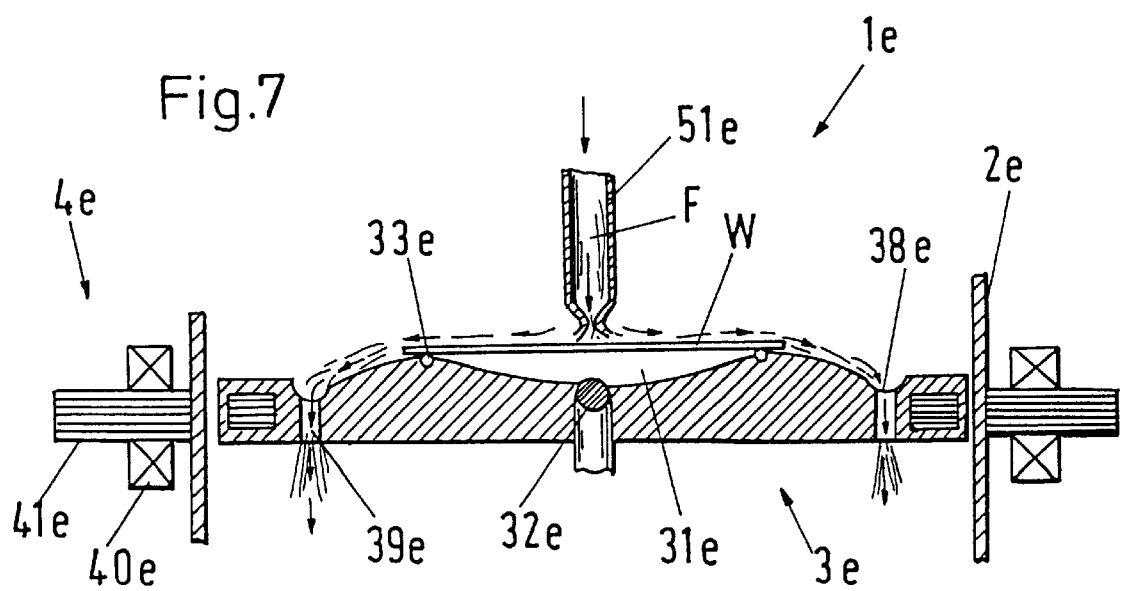

Further advantageous variants and embodiments result from the following description of exemplary embodiments with reference to the drawings. Shown, partly schematically and/or in section are:

FIG. 1 a first exemplary embodiment of the process chamber in accordance with the invention, FIG. 2 a second exemplary embodiment of the process chamber in accordance with the invention, FIG. 3 a section of a third exemplary embodiment of the process chamber in accordance with the invention in which the stator is arranged in an indentation in the housing wall, FIG. 4 a characteristic curve which shows the relationship between the restoring force and the axial deflection in a passive stabilising of the rotary head in the axial direction, FIG. 5 an exemplary embodiment of a substantially ring-shaped rotary head with means for the sucking fast of the object to be processed, e.g. of a wafer, at the rotary head, FIG. 6 an exemplary embodiment of a substantially ring-shaped rotary head in the interior of which a disc which is provided with passage channels is arranged and which forms a nozzle system and FIG. 7 an exemplary embodiment of a substantially ring-shaped rotary head with means for the sucking fast of the object to be processed, e.g. of a wafer, in a central region of the rotary head, and with a tub in the peripheral region of the rotary head which has passage openings at its base.

The exemplary embodiment of a process chamber 1 in accordance with the invention shown in FIG. 1 comprises a housing 2, a rotary head 3 with magnetically active elements 30 (e.g. laminated soft iron), a bearing and drive stator 4 with a stator winding 40 and with magnetically active elements 41 such as laminated soft iron parts and permanent magnets (not shown). The bearing and drive stator 4 is arranged radially around the rotary head 3, which carries a wafer W. The magnetically active elements are jacketed with non-metallic materials (such as e.g. Teflon®= polytetrafluroethylene, or PVDF=polyvinylidefluoride or a ceramic material) in order that the semiconductor material of the wafer W is screened off. Furthermore, applicators 50, 51, 52 for liquids and/or gases are arranged above the wafer W and an applicator 53 is arranged below the wafer W since the free space above and below the rotary head 3 allows applicators to be arranged above and below the rotary head 3 and thus the wafer W. The applicators are preferably designed displaceably and/or pivotally, which is indicated by corresponding arrows. Furthermore, a lighting head 6 for the lighting of the wafer W is symbolically illustrated.

Together with the bearing and drive rotor, which is formed by the rotary head 3 here, the bearing and drive stator 4 forms a so-called "bearing-free (disc) motor"; the rotary head 3 is thus journalled and driven without contact. The permanent magnets (not shown) which are provided in the stator 4 define a magnetic bias. The stator winding 40 comprises on the one hand a control winding for the control of the position of the rotary head 3 in the journalling plane, that is, in the plane of the bearing and drive stator 4; on the other hand, it comprises a drive winding for driving the rotary head 3, with it being possible for the control winding and the drive winding to form a common winding.

The method of functioning and the most varied of embodiments of a bearing-free motor of this kind are known per se. With a bearing-free motor of this kind the journalling and the driving of a rotor, here of the rotary head 3, is possible at the same time and at the same location. At this point it should also be mentioned that in the exemplary embodiment shown in FIG. 1 three degrees of freedom, namely the displacement of the rotary head 3 in the journalling plane and the rotation, can be actively controlled, whereas the remaining three degrees of freedom, namely the axial displacement of the rotary head 3 (that is, the displacement in the direction of the longitudinal axis) as well as the two degrees of freedom of the tilting, are passively stabilised.

Since the stator 4 is arranged outside the housing 2 of the process chamber, there is a region of the housing 2 which is arranged in the air gap between the rotary head 3 and the stator 4. In order to keep the air gap as small as possible and thereby to reduce the losses, the housing can be designed thinner in this region or else be manufactured of a material which is magnetically non-conducting (for example PVDF= polyvinylidefluoride) or which is only very poorly conducting (for example chromium-nickel alloys such as e.g. Hastelloy). In such a case one speaks of a tubular gap, which is located in the air gap of the bearing-free motor.

Furthermore, a supply mechanism which comprises a vacuum gripper 7 is illustrated in FIG. 1. This vacuum gripper 7 is arranged in a lock 8 in FIG. 1 which comprises two sliders 80 and 81. The slider 80 is movable in a plane perpendicular to the plane of the drawing, that is, quasi out of the plane of the drawing and into the plane of the drawing, and opens the lock 8 towards the outside. From the outside then the wafer W can be attached to the vacuum gripper 7. Then the slider 80 is closed and the slider 81 is opened. The vacuum gripper 7 can then transport the wafer W to the rotary head 3, with it naturally being necessary for the applicator 53 to be withdrawn laterally in order not to obstruct the supply of the wafer W. Alternatively, it can also be that the wafer W is already fastened to the rotary head 3 outside the lock 8 or, respectively, is connected to the latter, as will still be explained more precisely. The rotary head 3 is then applied together with the wafer W to the vacuum gripper 7 and then transported into the inner space of the housing 2 of the process chamber 1. This has the advantage that, firstly, the securing or fastening respectively of the wafer W to the rotary head 3 can take place at a location (namely outside the lock) at which the rotary head 3 is particularly easily accessible. Moreover, in an axial transporting of the rotary head 3 in the direction of its desired position the rotary head 3 is already practically drawn into its stable position by the stator 4 (passive axial stabilisation) prior to achieving its desired position. Finally, one also recognises in FIG. 1 an inlet connector 90 and an outlet connector 91 for the supply and removal of gases and an outlet tube 92 for conducting off liquids.

With the help of the lighting head 6 it is finally also possible to illuminate the wafer W. This is possible above all because a precise positioning of the wafer W in the journalling plane (naturally within the limits of the air gap) is possible. A process chamber 1 of this kind is thus also suitable in particular for the manufacture of semiconductors with simple structures such as for example thyristors. (e.g. GTO's).

FIG. 2 shows a further exemplary embodiment of a process chamber in accordance with the invention. In the following description of FIG. 2, similar parts are designated with the same reference symbol as in FIG. 1, but however supplemented by the letter "a" (with the exception of the wafer W). As a result of this the process chamber 1a comprises here the housing 2a, in the inner space of which the rotary head 3a is arranged, which supports the wafer W. The rotary head 3a is supported and rotationally driven by the stator 4a. The stator 4a is however displaceable in the axial direction and to a slight extent tiltable, as is indicated by the corresponding arrows. Through this the axial position of the rotary head 3a in the inner space of the housing 2a can be adjusted and the tilting of the rotary head 3a relative to the (stationary) housing 2a can likewise be adjusted within certain limits. Relative to the housing 2a thus all six degrees of freedom of the rotary head 3a are thereby actively controllable. If one considers the rotary head 3a relative to the stator 4a, then it is here also a matter of a journalling in which only three degrees of freedom of the rotary head 3a can be actively controlled, namely its position in the journalling plane and the rotation. The axial displacement of the rotary head 3a as well as the two degrees of freedom of the tilting are namely here also passively stabilised relative to the stator 4a, even when they are settable relative to the housing 2a.

Furthermore, a nozzle system 54a (applicator) is also provided in FIG. 2 which can for example conduct process gas into the inner space of the housing 2a. This nozzle system 54a can be axially displaceably designed. The process gas is conducted out of the inner space of the process chamber 1a again via the outlet connector 91a. Furthermore, one also recognises a heating spiral 55a (applicator) which is arranged beneath the rotary head 3a and, since the wafer W is freely accessible from below, a homogeneous heating of the wafer W can be achieved. Of course still further applicators such as electrodes or radiation sources or other applicators can also be arranged in the inner space of the housing of the process chamber in the process chambers in accordance with FIG. 1 and FIG. 2. The process chamber 1a shown in FIG. 2 is particularly suitable for CVD processes (Chemical Vapour Deposition).

FIG. 3 shows a section of an exemplary embodiment of a process chamber 1b in which the stator 4b is arranged in an indentation of the housing 2b. In the event that the diameter of the rotary head 3b is to be kept small relative to the diameter of the inner space of the housing 2b, e.g. in order to be able to take the wafer W together with the rotary head 3b out of the inner space of the housing 2b more easily, this exemplary embodiment is very advantageous.

In FIG. 4 the relationship between the restoring force F and the axial deflection z from the desired position of the rotary head is graphically illustrated. One recognises that when viewed in the respective positive or negative axial direction (z direction) the restoring force first increases in magnitude to a value $F_{max}$ or $-F_{max}$ respectively up to a maximal deflection $Z_{max}$ or $-Z_{max}$ respectively, but decreases again however when this deflection is exceeded. This means that if the same force that led to the corresponding deflection still acts in the axial direction on the rotary head during the exceeding of the deflection $Z_{max}$ or $Z_{max}$ respectively, then the rotary head escapes from the journalling.

An exemplary embodiment of a rotary head 3c which is substantially designed in the shape of a ring is shown in FIG. 5. This means that the wafer W can be processed from both sides. The rotary head 3c has means for the sucking on of the wafer W in the form of a depression chamber 31c in which a depression can be produced via a valve 32c. Through this the wafer is sucked on against the O-rings 33c and 34c. This process can take place outside the inner space of the housing. Then the valve 32c is closed so that the depression is maintained in the depression chamber 31c and the wafer W remains sucked on at the O-rings 33c and 34c. The wafer W which is connected to the rotary head 3c or secured to the rotary head 3c respectively in this manner can then be introduced into the inner space of the process chamber (not illustrated here) together with the rotary head 3c, as has already been explained previously. If the underside of the wafer W for example is still so rough that the wafer does not remain sucked fast at the O-rings 33c and 34c in spite of the closing of the valve 32c, then a small vacuum pump (not illustrated) which is inductively fed, and indeed preferably from outside the housing, can be provided in place of the valve. For the feeding for example a portion of the energy of the rotary drive field can be used (but only during the operation, however).

FIG. 6 shows an exemplary embodiment of a rotary head 3d, in the interior of which a disc 35d is arranged which is provided with passage channels 36d. This disc 35d acts as a nozzle system through which the wafer W can be charged (from below here) with gases or vapours. The wafer W is held at a distance from the disc 35d (here above the disc 35d) with the help of the gripper 37d, which is provided with a spring. The wafer W is thus accessible from both sides, with it likewise being possible for the securing of the wafer W to the rotary head 3d to take place outside the housing of the process chamber. The rotary head 3d which is thus equipped with the wafer can then be introduced into the inner space of the housing of the process chamber.

FIG. 7 shows an exemplary embodiment of a process chamber 1e with a housing 2e, in the inner space of which a substantially disc-shaped rotary head 3e is arranged. This rotary head 3e is provided with means for the sucking fast of the wafer W, and indeed in a central region of the rotary head 3e. These means comprise a valve 32e (e.g. a ball valve). If now a depression is produced through the ball valve 32e, then a suction pressure is produced in the depression chamber 31e under the wafer W which sucks the wafer W on against the O-ring 33e. If one closes the valve 32e, then the wafer W remains sucked on against the O-ring 33e. This can take place outside the inner space of the housing 2e of the process chamber 1e. Alternatively, a vacuum pump which is inductively fed can also be provided instead of the valve 32e, as already described with reference to FIG. 5, with it being possible to use portions of the energy of the rotary drive field for the feeding. Around the central region the rotary head inclines downwardly in the outward direction and opens into a tub 38e. This tub 38e is provided with passage openings 39e at its base. If now a liquid F is applied centrally to the wafer W from a liquid applicator 51e, then as a result of the rotation of the rotary head 3e the liquid F flows outwardly over the surface of the wafer W over the wafer edge, along the declining regions of the rotary head 3e into the tub 38e and an accumulation of liquid F which has not run off is avoided so that a homogeneous liquid film can arise on the wafer W. Through the passage openings 39e in the base of the tub the liquid F can enter below, where a corresponding outlet connector (not shown) can then be provided in the housing, through which the liquid F can be conducted off. If the liquid F, as shown here, need not run off over the edge of the rotary head 3e, the air gap can be chosen to be very small, which reduces the losses. Of course it is however also possible to design the rotary head in such a manner that the liquid which flows from the wafer W over the peripheral region of the rotary head enters below through the air gap, where it can then be conducted off.

As already mentioned, the described embodiments are only examples of how the process chamber in accordance with the invention can be designed. As uses, in particular the innumerable processing steps in the manufacture. of semiconductors, especially those which have already been mentioned in the introduction, come under consideration.

What is claimed is:

1. A process chamber in which various processing steps in the manufacture of semiconductors can be carried out for a wafer comprising:
    a process chamber (1) having an interior for the processing of a disc-shaped object and an exterior for isolating the disc-shaped object during processing;
    a rotationally driven rotary head (3) in the process chamber (1), the rotationally driven rotary head (3) serving as a holder to expose a substantially disc-shaped object to be processed (W) from either side of the disc-shaped object within the interior of the process chamber (1);
    at least one applicator (50, 51, 52, 53) being provided in the process chamber for the provision of a medium which acts on the disc-shaped object to be processed (W) from either side of the disc-shaped object; and,
    means (4) to suspend and drive the rotary head (3) without contact, the means (4) to suspend and drive the rotary head (3) being arranged radially around the rotary head (3) on the exterior of the process chamber (1).

2. The process chamber in accordance with claim 1 wherein:
    the means (4) to suspend and drive the rotary head (3) arranged radially around the rotary head (3) comprises a magnetic bearing/drive unit.

3. The process chamber in accordance with claim 2 wherein:
    the magnetic bearing/drive unit comprises a stator (4) which is arranged outside a housing (2) of the process chamber and the rotary head (3) is arranged inside the housing (2), with the housing wall forming a tubular gap which seals off the inner space of the housing (2).

4. The process chamber in accordance with claim 1 wherein:
    the means to suspend and drive the rotary head (3) includes:
    means to actively control the two degrees of freedom of displacement in the bearing plane;
    means to actively control the axial displacement;
    means to actively control the two degrees of freedom of tilting; and
    means to actively control the rotation.

5. The process chamber in accordance with claim 1 characterized in that two degrees of freedom of the rotary head (3) can be actively controlled, namely the two degrees of freedom of displacement in the bearing plane, whereas the other four degrees of freedom are passively stabilized.

6. The process chamber in accordance with claim 1 characterized in that three degrees of freedom of the rotary head (3) can be actively controlled namely the two degrees of freedom of displacement in the bearing plane and the rotation, whereas the other three degrees of freedom are passively stabilized.

7. The process chamber in accordance with claim 1 wherein:
    the rotary head (3) is designed to connect the object to be processed (W) outside the inner space of the process chamber; and,
    the rotary head (3) with the object to be processed (W) can then be brought into the inner space of the process chamber.

8. The process chamber in accordance with claim 1 wherein:
    the rotary head (3, 3a, 3b, 3c, 3d) is designed to permit the object (W) held by the rotary head to be charged from both sides with a medium which is provided by applicators (50, 51, 52, 53; 54a, 55a).

9. The process chamber in accordance with claim 8 wherein:
    the rotary head (3, 3a, 3b, 3c, 3d) is designed to be substantially in the shape of a ring.

10. The process chamber in accordance with claim 9 wherein:
    the interior of the ring-shaped rotary head (3d) has a disc (35d) with passage channels (36d) fitted in, with the object to be processed (W) being held at a distance from the disc (35d) by the rotary head.

11. The process chamber in accordance with claim 1 wherein:
    the rotary head (3e) is designed substantially in the shape of a disc and the object to be processed is held in the central region of the rotary head (3e); and,
    the rotary head (3e) defines a declination in the peripheral region around this central region in order that a liquid (F) applied to the object to be processed flows outwardly over the object to be processed (W) when the rotary head (3e) is rotationally driven to run off over the peripheral region of the rotary head (3e).

12. The process chamber in accordance with claim 11 wherein:
    the rotary head (3e) has a tub (38e) around the peripheral region with the declination; and, the tub (38e) defines passage openings (39e) at its base for the liquid (F) which is caught in the tub (38e).

13. The process chamber in accordance with claim 1 wherein:
    the rotary head (3c, 3e) at a means (32c, 32e) has a depression communicated to the object to be processed (W) to enable the object to be processed (W) to be held fast at the rotary head (3c, 3e) by a vacuum.

14. The process chamber in accordance with claim 13 wherein:
    a vacuum pump is provided for the production of the depression at the rotary head (3c, 3e).

15. The process chamber in accordance with claim 14 wherein:
    the vacuum pump comprises inductive energy supply.

* * * * *